June 3, 1969 D. D. RUSSELL 3,448,293
FIELD EFFECT SWITCHING CIRCUIT
Filed Oct. 7, 1966
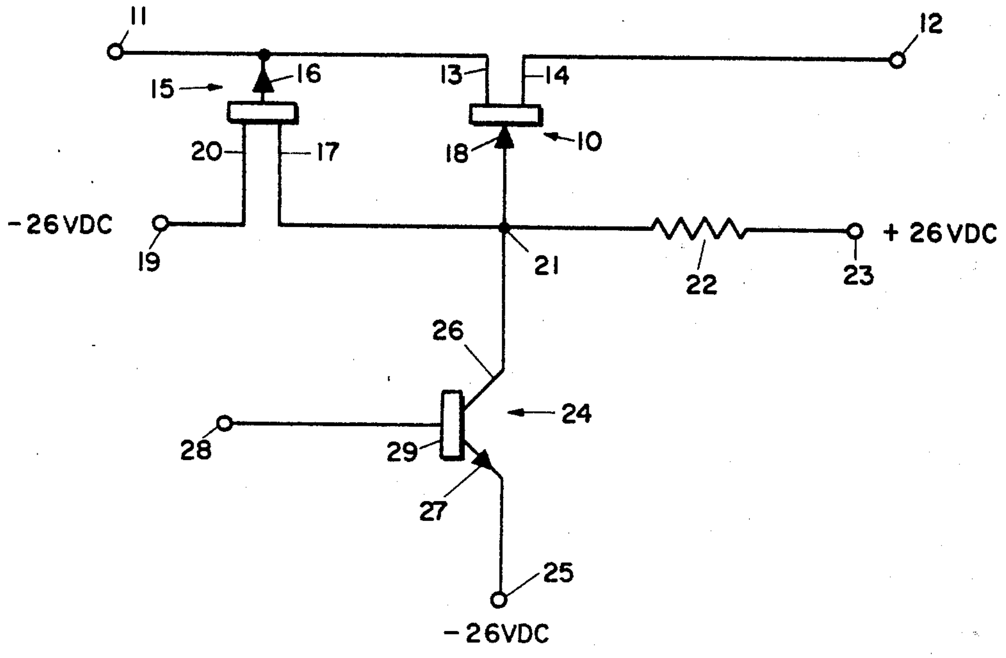
INVENTOR.
DOUGLAS D. RUSSELL
BY David E. Hoppe
ATTORNEY 3,448,293

FIELD EFFECT SWITCHING CIRCUIT

Douglas D. Russell, Wrentham, Mass., assignor to The Foxboro Company, Foxboro, Mass., a corporation of Massachusetts Filed Oct. 7, 1966, Ser. No. 585,166
Int. Cl. H03k 17/60
U.S. Cl. 307—251 10 Claims This invention relates to solid state switching circuits and more particularly to switching circuits employing field effect transistors.

It is highly desirable to replace conventional relays with solid state switching devices in order to obtain the advantages of improved reliability and greatly increased speed obtainable thereby. In order to employ transistors for switching, it is necessary to solve problems not usually involved in the use of mechanical relays. Problems related to switch and trigger isolation, as well as considerations of non-linearity must be solved before an acceptable solid state switch may be perfected. It is desirable to provide for a very high impedance across the switch when it is in the open condition, in the same order of magnitude as with relay; it is desirable to have a low impedance across the solid state switch in the closed condition, so that there will be a negligible signal transfer loss in various applications. In addition, it is highly desirable that current from the actuating control source not affect the switched signal circuit. The solid state switch must also be designed to operate uniformly and linearly over the entire range of signal magnitudes and polarities anticipated.

The field effect transistor is particularly suitable for a component of such a switching circuit. Important in such an application are the high impedances between the field effect gate and the source and drain elements. Also relevant is the extremely high impedance across the field effect transistor in its pinched-off condition. Several circuits employing a single field effect transistor for switching have been proposed, but these suffer from various drawbacks. Typically, the prior circuit has low isolation between the control circuit and the signal circuit, or it becomes non-linear in the event a change in magnitude of the signal level occurs. In order to remedy these deficiencies and obtain the potential advantages from field effect transistors, the present invention proposes a dual-transistor configuration designed to keep a substantially constant impedance across the actuated field effect signal switching transistor notwithstanding changes in magnitude of the input signal. Further, the circuit provides for an extensive permissible range of input signal levels over which the performance of the switching transistor is substantially linear.

An object of this invention is to provide an improved field effect transistor switching circuit having performance parameters comparable with those of mechanical relays, while affording improved reliability and switching speeds.

Another object of this invention is to provide for a solid state switching circuit providing high isolation between the control circuit and the signal switching circuit and having essentially linear performance characteristics over a predetermined range of input levels.

Another object of this invention is to provide a solid state switching circuit that is reliable, fast, simple and efficient, having essentially a constant impedance in its switched-on state over the range of input signal levels expected.

Briefly stated, the invention employs a field effect switching transistor in series with the signal transfer circuit with a source follower field effect transistor arranged to make the gate potential of the switching transistor follow the signal input level in order to maintain a constant impedance across the switching transistor in its switched-on condition over the design range of input signal levels.

These and other advantages of the invention may be in part apparent from the following description thereof and in part from the single figure showing a schematic of an embodiment.

Field effect transistor 10 is connected in series between signal input 11 and signal output 12 with its source element 13 connected to input 11 and its drain element 14 connected to output 12. MOS or junction devices may be used.

Field effect transistor 15 is connected in a source-follower configuration with gate 16 of follower 15 connected to source 13 of switching transistor 10 and source 17 of follower 15 connected to gate 18 of switching transistor 10. It is to be noted that transistors 10 and 15 should be of opposite channel types. Illustratively, switching transistor 10 is an n-channel type while follower transistor 15 is a p-channel type; however, these types may be reversed with proper revision of the remainder of the circuit. A negative potential 19, illustratively —26 v. D.C. is connected to drain 20 of follower 15. The junction of source 17 and gate 18, conveniently designated junction 21, is connected through resistance 22 to a positive potential, illustratively +26 v. D.C. As described below, potentials 19 and 23 bracket the permissible range of input levels for linear operation.

The remainder of the illustrated circuit shows junction 21 connected to a switching control circuit consisting of transistors 24. Control transistor 24 is in series between junction 21 and negative power supply 25, illustratively —26 v. D.C., with junction 21 connected to the collector 26 of transistor 24 and the emitter of transistor 24 connected to negative power supply 25. The switching control signal 28 is impressed at base 29 of control transistor 24.

At input 11, are impressed analog signals having levels typically in the range of about —25 to +25 volts. At times the switching circuit is to be switched on, control signal 28 is zero or negative with respect to emitter 27, thereby making transistor 24 effectively non-conducting, and allowing gate 18 and source 17 of transistors 10 and 15 respectively to function without its influence.

The analog signal at input 11 is also at gate 16 of follower 15; thereby when the circuit is switched on the potential at source 17 of follower 15 allows the level of the input signal, typically being within a few volts thereof, the precise voltage being a function of the pinch-off characteristic of follower transistor 15. Since source 17 of follower 15 substantially duplicates the input signal, gate 18 of switching transistor 10, being connected to source 17, thereby follows the input signal. In this manner, gate 18 of switching transistor 10, is kept at a level within a few volts of input 11, which is connected to source 13 of transistor 10, notwithstanding input excursions of —25 v. D.C. to +25 v. D.C. This stable voltage difference between gate 18 and source 13 has the effect of holding the impedance between source 13 and drain 14 of switching transistor 10 substantially constant. This being the case, the signal appearing at input 11 is passed through the stable low impedance switching transistor 10 to output 12 without any non-linearity effect that may heve been contributed by a variation in the impedance of switching transistor 10.

When the circuit is desired to be switched off, the control signal at control input 28 biases on the base 29 of transistor 24, with a positive potential with respect to emitter 27 thereby making transistor 24 conduct and effectively clamping terminal 21 to substantially —26 volts. With this potential on the gate 18, transistor 10 presents a very high impedance between its source and drain, typically several hundred megohms.

It is desirable for the voltage sufficient for pinch-off of follower 15 to be a smaller amount than that required to pinch off switching transistor 10. Thus switching transistor 10 will be on whenever follower 15 is on, thereby insuring proper operation over the entire design range of input level. Note that gate 16 of transistor 15 is connected to source 13 of transistor 10, while source 17 of transistor 15 is connected to gate 18 of transistor 10. It can be seen that for both transistors to be on, their channel types must be of opposite polarities so that proper biasing may be obtained. Gate 16 is positive to source 17 by an amount slightly less than the pinch-off potential for transistor 15; gate 18 is negative by the same amount to source 13.

The range of input levels is limited by the power supply potentials applied to the circuit. If the potential at input 11 is about −25 v. D.C., the −26 v. D.C. on drain 20 may cause follower 15 to saturate and thus not functions. Terminal 21 cannot follow inputs above about +25 v. D.C., owing to the limitation of the positive +26 v. D.C. supply potential at 23. Higher supply potentials will permit a greater voltage range of input signals.

While there has been shown what is considered to be a preferred embodiment of the invention, it will be manifest that many changes and modifications may be made therein without departing from the essential spirit of the invention. It is intended, therefore, in the annexed claims to cover all such changes and modifications as fall within the true scope of the invention.

What is claimed is:

1. A field effect transistor switching circuit for analog signals comprising:

- a signal input terminal and a signal output terminal,
- a first electrical potential and a second electrical potential,
- a first field effect transistor of a first channel type having its source and drain elements interconnected in series between said signal input terminal and said signal output terminal,
- a second field effect transistor having an opposite type to that of said first transistor having its gate element responsive to said signal input terminal and having its source and drain elements interconnected between said first electrical potential and the gate of said first transistor, and
- a resistance interconnected between said second electrical potential and said gate of said first transistor.

2. The field effect transistor switching circuit of claim 1 with said gate of said first transistor responsive to a control circuit.

3. The field effect transistor switching circuit of claim 1 wherein said first and second electrical potentials are of opposite polarities thereby permitting circuit operation with a range of input signal levels therebetween said potentials.

4. The field effect transistor switching circuit of claim 1 wherein the voltage required to pinch off said first transistor is greater than the voltage required to pinch off said second transistor.

5. The field effect transistor switching circuit of claim 1 with a control circuit effective to clamp said gate of said first transistor to an electrical potential selected to render said switching circuit inoperative when it is desired to switch off said circuit.

6. The field effect transistor switching circuit of claim 1 wherein said first transistor is an n-channel type, said second transistor is a p-channel type and said first electrical potential is negative with respect to said second electrical potential.

7. The field effect transistor switching circuit of claim 1 wherein said first transistor is a p-channel type, said second transistor is an n-channel type, and said first electrical potential is positive with respect to said second electrical potential.

8. The field effect transistor switching circuit of claim 1 wherein said first transistor presents a substantially constant low impedance between said signal input terminal and said signal output terminal over a range of input signals potentials almost as great as the range of potentials between said first and second electrical potentials thereby functioning in a substantially linear manner.

9. The field effect transistor switching circuit of claim 2 providing for a high impedance isolation between said control circuit and said switching circuit.

10. The field effect transistor switching circuit of claim 5 wherein said control circuit clamps said gate of said first transistor to a potential substantially similar to said first electrical potential to make said switching circuit switched off.

References Cited

UNITED STATES PATENTS

| | | | |
|---|---|---|---|
| 3,378,779 | 4/1968 | Priddy | 307—251 X |
| 3,386,053 | 5/1968 | Priddy | 307—304 X |

DONALD D. FORRER, *Primary Examiner.*

U.S. Cl. X.R.

307—304